(12) United States Patent
Chauhan et al.

(10) Patent No.: US 7,790,597 B2
(45) Date of Patent: Sep. 7, 2010

(54) SOLDER CAP APPLICATION PROCESS ON COPPER BUMP USING SOLDER POWDER FILM

(75) Inventors: Satyendra S. Chauhan, Sugar Land, TX (US); Rajiv C. Dunne, Murphy, TX (US); Gary P. Morrison, Garland, TX (US); Masood Murtuza, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/134,337

(22) Filed: Jun. 6, 2008

(65) Prior Publication Data
US 2009/0014898 A1    Jan. 15, 2009

Related U.S. Application Data

(60) Provisional application No. 60/949,139, filed on Jul. 11, 2007.

(51) Int. Cl.
*H01L 23/48* (2006.01)
*H01L 21/44* (2006.01)

(52) U.S. Cl. .................. 438/613; 257/737; 257/738; 257/E23.01; 257/E23.023; 257/E21.476; 438/614; 438/615; 438/616

(58) Field of Classification Search ......... 257/737–738, 257/E23.054, E23.01, E23.023, E21.476; 438/613–616
See application file for complete search history.

(56) References Cited

U.S. PATENT DOCUMENTS

| 5,192,835 | A | 3/1993 | Bull |
| 5,556,023 | A | 9/1996 | Kuramoto et al. |
| 5,591,037 | A * | 1/1997 | Jin et al. ................. 439/91 |
| 6,220,501 | B1 | 4/2001 | Tadauchi et al. |
| 6,416,590 | B1 | 7/2002 | Hirata et al. |
| 2001/0008160 | A1* | 7/2001 | Suzuki et al. ........... 156/64 |
| 2008/0213613 | A1* | 9/2008 | Kuramoto et al. ........ 428/577 |

FOREIGN PATENT DOCUMENTS

| JP | 04127548 A | 4/1992 |
| JP | 08064637 A | 3/1996 |
| JP | 2006134982 A | 5/2006 |
| WO | WO 2006067827 A1 * | 6/2006 |

* cited by examiner

*Primary Examiner*—A. Sefer
*Assistant Examiner*—Ermias Woldegeorgis
(74) *Attorney, Agent, or Firm*—Yingsheng Tung; Wade J. Brady, III; Frederick J. Telecky, Jr.

(57) ABSTRACT

A method used during the formation of a semiconductor device assembly can include contacting an end of a conductive bump (which can be a pillar, ball, pad, post, stud, or lead as well as other types of bumps) with a conductive powder such as a solder powder to adhere the conductive powder to the end of the bump. The powder can be flowed, for example by heating, to distribute it across the end of the bump. The flowed powder can be placed in contact with a conductive pad of a receiving substrate and can then be reflowed to facilitate electrical connection between the bump and the conductive pad.

11 Claims, 5 Drawing Sheets

SOLDER CAP APPLICATION PROCESS ON COPPER BUMP USING SOLDER POWDER FILM

CROSS-REFERENCE TO RELATED APPLICATION

This application claims priority to U.S. Provisional Patent Application Ser. No. 60/949,139 filed on Jul. 11, 2007, the disclosure of which is incorporated by reference herein in its entirety.

FIELD OF THE INVENTION

This invention relates to the field of semiconductor device assembly, and more particularly to the electrical attachment between a semiconductor wafer or semiconductor wafer section and a receiving substrate.

BACKGROUND OF THE INVENTION

A semiconductor device such as memory device, logic device, microprocessor, etc. is formed with conductive external connections to facilitate electrical coupling with test equipment, and eventually connection with a substrate such as a printed circuit board (PCB). Through-hole packages having leads which project through a printed circuit board, such as single in-line packages (SIPs) and dual in-line packages (DIPs), progressed to surface mount leads such as "j" style leads, which in turn progressed to bump-style connections such as flip chip and ball grid array (BGA) devices.

Current methods of connecting a semiconductor device having bump-style leads with landing pads of a receiving substrate such as a PCB include wet solder processes. In a first wet solder process, solder flux is applied to the conductive bumps of the semiconductor device to reduce surface tension (i.e. improve "wettability") and to remove oxides. Subsequently, the bumps of the device are placed in contact with the landing pads of the receiving substrate using the solder flux to temporarily adhere the structures together, then the assembly is placed into a molten solder wave such that solder adheres to the bumps and the landing areas to electrically and mechanically interconnect the two structures. An underfill may then be used to reduce sheer stresses between the electrical contacts.

In a second wet solder process, electrolytic deposition is used to plate the copper bumps with solder. The plated bumps are placed into physical contact with the landing pads, and the solder is reflowed to electrically and mechanically join the semiconductor device and receiving structure.

In a third wet solder process, an electroless deposition process is performed by immersing the bumps in an aqueous solution containing plating chemicals to plate the bumps with solder. The plated bumps are then joined to the landing pads by placing the two structures into physical contact. The solder is then reflowed to electrically and mechanically join the semiconductor device and receiving structure. Underfill may also be used with electrolytic and electroless plated devices.

SUMMARY OF THE EMBODIMENTS

Applicants realize that a new approach needs to be taken for the chip-to-substrate assembly process. The assembly has to be performed so that devices having increasingly fine pitch connections are less susceptible to solder bridging. With conventional processes, the entire bump is typically coated with solder which increases the width of the bump and can result in electrical shorts between adjacent bumps. To avoid bridging, the pitch between adjacent bumps must be increased which decreases the allowable number of bumps in a given area (bump density). Additionally, conventional processes expose fragile semiconductor wafers and wafer sections to harsh chemical processes which can damage the wafer or wafer section and associated exposed electronics. Further, a plating line is capital intensive in that it requires a large amount of floor space and equipment.

The assembly process of various inventive embodiments comprises a reliable, low cost method suitable for high and low lead counts and for devices of any size including chip-scale and wafer-scale devices. The transfer of conductive powder and connection of components in the manner of the claimed embodiments can provide a conductor which is self-aligned to conductive bumps of a semiconductor device by contacting the conductive powder with only ends of the bumps, such that excess conductive powder is not applied to other features. This can assist to reduce or eliminate solder bridging and other incidental shorting of conductive features. Further, solder wave equipment is not necessary, which decreases equipment and space requirements to provide a low cost alternative to conventional processing.

An embodiment of a method used to form a semiconductor device comprises providing a film comprising an adhesive and a conductive powder which is adhered to the adhesive of the film. An adhesive is applied to an end of a conductive bump, and the adhesive on the end of the bump is contacted with the conductive powder adhered to the adhesive to transfer the conductive powder from the film to the end of the conductive bump. The conductive powder is flowed to distribute the conductive powder across the end of the conductive bump, then the flowed conductive powder on the end of the conductive bump is placed in physical contact with a conductive pad. The flowed conductive powder is reflowed to facilitate electrical connection between the conductive bump and the conductive pad.

In another embodiment, method used to form a semiconductor device assembly comprises providing a semiconductor device having a plurality of conductive bumps formed thereon, and providing a receiving substrate having a plurality of conductive landing pads formed thereon. Also provided is a film comprising an adhesive and a dry solder powder which is adhered to the adhesive of the film. An adhesive is applied to ends of the plurality of conductive bumps, and the adhesive on the ends of the plurality of conductive bumps is contacted with the dry solder powder adhered to the adhesive to transfer the solder powder to an end of each conductive bump. The solder powder is heated to flow the solder powder and to distribute the solder powder across the end of each conductive bump. The flowed solder powder is cleaned and contacted with one of the plurality of conductive landing pads of the receiving substrate. With the flowed solder powder on the end of each conductive bump contacting one of the plurality of conductive landing pads of the receiving substrate, the flowed solder powder is reflowed to facilitate electrical connection between the plurality of conductive bumps and the plurality of conductive landing pads.

Another embodiment comprises a method used to form a semiconductor device, comprising providing a carrier material having first and second sides and a solder powder coated on both the first and second sides of the carrier material. Also provided are first and second semiconductor dice, each having conductive bumps thereon. Next, the conductive bumps on the first semiconductor die is contacted with the solder powder on the first side of the carrier material while simultaneously contacting the conductive bumps on the second semiconductor die with the solder powder on the second side of the carrier material, thus simultaneously adhering the solder powder to the bumps on the first semiconductor die and on the second semiconductor die. The solder powder is flowed to distribute the solder powder across an end of the conductive bumps of the first semiconductor die and the second semiconductor die.

Yet another embodiment comprises an in-process semiconductor device assembly comprising at least one conductive bump having an end, an adhesive material on the end of the at least one bump, a conductive powder adhered to the end of the at least one conductive bump by the adhesive material, and a receiving substrate comprising at least one conductive landing pad. The at least one conductive landing pad is adapted for electrical connection with the at least one conductive bump using the conductive powder.

It is a technical advantage of an embodiment of the invention that while an entire bump may be exposed, the conductive powder can be adhered to only a tip of the bump so that solder bridging is reduced.

It is another advantage of an embodiment of the invention that the conductive powder can be applied to only those areas where it is desired such that the conductive powder is self-aligned to the bumps and excess conductive powder, and thus electrical shorting, is reduced.

It is another advantage of an embodiment of the invention that conductive powder can be applied to two or more devices simultaneously to increase production throughput.

The technical advances represented by certain embodiments of the invention will become apparent from the following description of the preferred embodiments of the invention, when considered in conjunction with the accompanying drawings and the novel features set forth in the appended claims.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

Because the structural features of each embodiment vary greatly in scale, it should be noted that the FIGS. have been drawn to facilitate understanding of the inventive embodiments rather than to maintain strict scale between features.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and changes may be made without departing from the scope of the invention.

Figure 1:
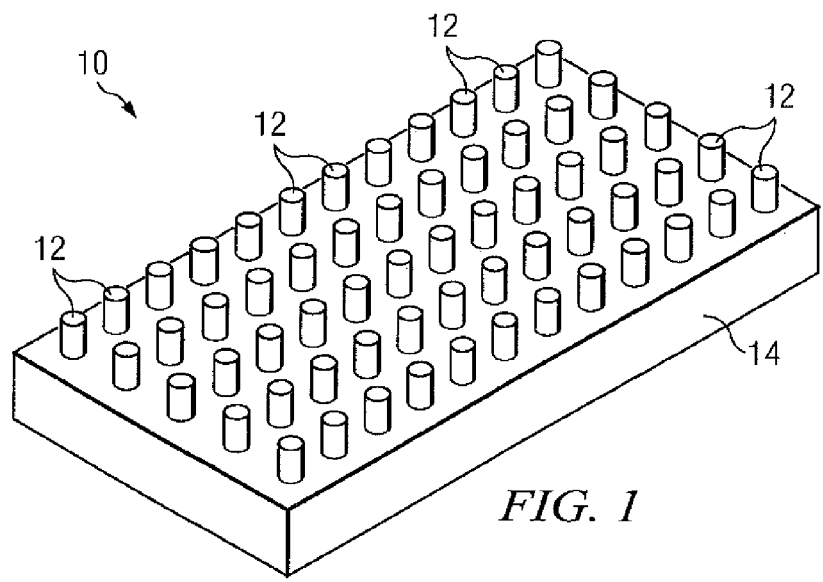
FIG. 1 is a perspective depiction of a semiconductor wafer section such as a semiconductor die having conductive bumps which can be used in an embodiment of the invention.

A first embodiment of the invention is depicted in FIGS. 1-8. FIG. 1 depicts a semiconductor wafer section 10 which, in this embodiment, is a completed, unpackaged semiconductor device. The semiconductor device comprises conductive bumps 12, for example formed from copper, and a semiconductor material 14 having conductive circuitry (not individually depicted) formed thereon and therein in accordance with conventional manufacturing techniques.

While various methods may be used to provide the conductive bumps on the semiconductor device, one exemplary method begins with the formation of a photoresist layer over a semiconductor wafer at a wafer bumping facility. The photoresist layer is patterned to expose individual pads such as bond pads on the semiconductor wafer, while the remainder of the wafer remains covered by the patterned photoresist. The openings in the photoresist layer can be any sufficient shape such as round, oval, square, or rectangular, but will typically be the size and shape of the bond pad unless there is reason for forming the bumps using an alternate size or shape. After forming the openings in the photoresist, the wafer is exposed to a plating bath to electroplate conductive material such as copper into the openings, which physically and electrically contact the bond pads. Electroplating can be continued until an upper surface of the bump reaches the top of the opening in the photoresist, or before the bump reaches the top of the opening if the bumps are of sufficient height.

In one embodiment, the bumps can be between about 10 μ and about 50 μ in height, and can comprise various shapes such as circular with a diameter of about 10 μ, square having sides each about 10 μ in length, or various other shapes. The bumps can have a pitch of between about 25 μ and about 80 μ.

The general term "bumps" as is used herein will be understood to include various types of electrical connections, for example pillars, balls, pads, posts, studs, and leads as well as other types of bumps.

After forming the bumps, the photoresist can be removed to expose the entire height of the bumps. In an embodiment using wafer scale processing, the process described below is performed on the entire wafer. However, the text below describes an embodiment in which the wafer is diced subsequent to forming the bumps to provide a plurality of semiconductor dice, with individual, unpackaged devices being processed as depicted in FIG. 1 as element 10.

Figure 2:
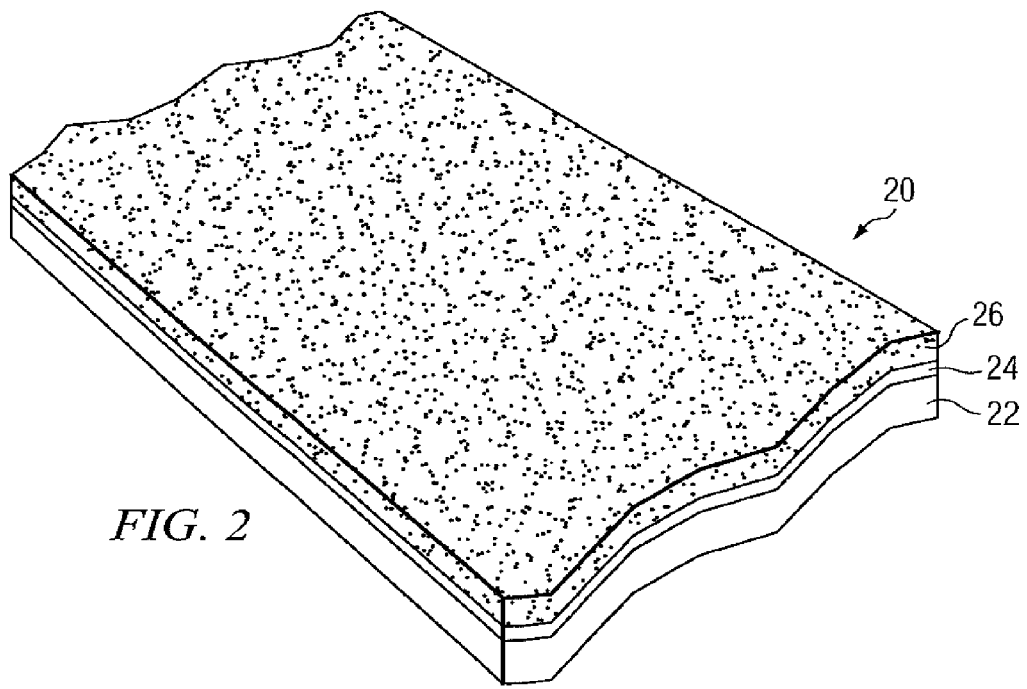
FIG. 2 is a perspective depiction of a film comprising conductive powder which can be used in an embodiment of the invention.

This embodiment further comprises the use of a conductive powder film 20 as depicted in FIG. 2. In this embodiment, film 20 comprises a layer of supporting carrier material 22 such as polyimide, a layer of adhesive 24, and a layer of conductive powder 26 such as solder powder. The base polyimide film 22 can be coated with an adhesive material or an adhesive film 24 first, then solder powder 26 can be applied (spray coated) on to the adhesive material 24. It will be appreciated that the supporting material 22 can be omitted if the adhesive layer 24 is used as a supporting material, in which case the film can comprise one layer of adhesive, which also functions as the supporting material, and one layer of conductive powder.

In the film as depicted in FIG. 2, the supporting layer 22 can be between about 200 μ and about 400 μ, thick, the adhesive layer can be between about 25 μ and about 50 μ thick, and the layer of conductive powder can be between about 5 μ and about 15 μ thick. The adhesive layer can comprise a thermoplastic or thermoset material or an adhesive film. The conductive powder can comprise solder such as eutectic solder, lead-free solder, etc. In one embodiment, the solder powder comprises solder spheroids having an average diameter of about 10 μ, and ranging from between about 5 μ and about 15 μ in diameter.

To produce the film 20, a layer of supporting material 22 such as polyimide between about 200 μ and about 400 μ thick is produced using known manufacturing techniques. Adhesive 24 can be rolled or sprayed on one side of the supporting material 22, then the conductive powder 26 is adhered to the adhesive using a technique comprising spraying on the powder, rolling the adhesive in powder, or another similar method.

Figure 3:
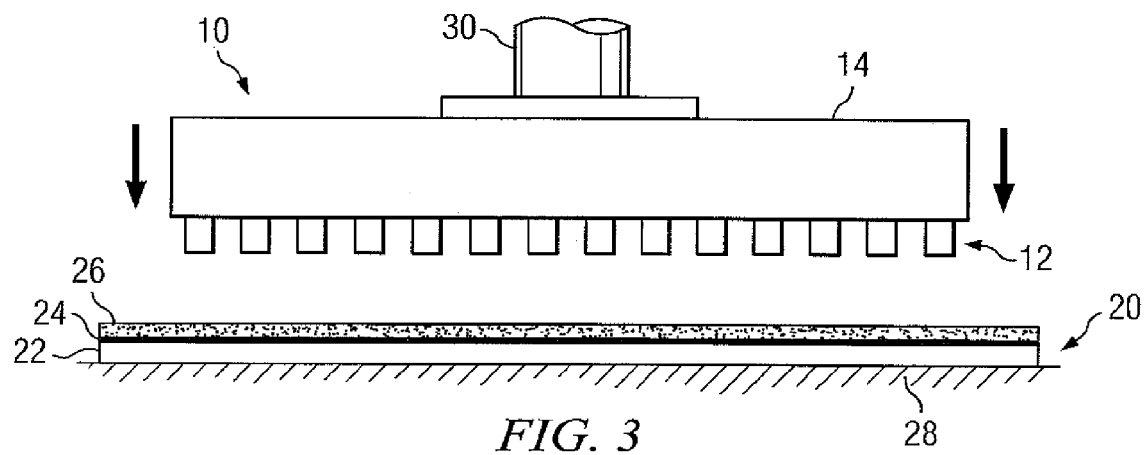
FIG. 3 is a cross section depicting the transfer of conductive powder from the film of FIG. 2 onto the conductive bumps of the device depicted in FIG. 1.

Next, the conductive powder film 20 can be placed onto a solid supporting surface 28 so that the solder powder 26 is accessible as depicted in FIG. 3. A semiconductor die 10 is loaded into a carrier such as a vacuum nozzle 30 of a pick-and-place system. An adhesive material, for example solder flux 40 (FIG. 4) or another suitable material, can be applied to the bumps 12, for example by dipping the ends of the bumps in flux material, then the adhesive 40 is contacted with the conductive powder 26. In this embodiment, sufficient pressure and temperature are applied to transfer the powder from the film to the bumps.

Any sufficient solder flux can be applied to the bumps as an adhesive using conventional solder flux application techniques. The amount of flux which remains on the bumps can be controlled using an air blast subsequent to dipping the bumps to remove excessive flux and even out remaining flux.

During the transfer of the solder powder from the film to the bumps, the temperature and pressure are controlled to allow transfer of a sufficient amount of material. For example, the temperature of the conductive powder during transfer of the powder to the conductive bump (i.e. a "transfer temperature") can be maintained to between about 160° C. and about 200° C. More preferably the transfer temperature can be 180° C. or less, for example between about 165° C. and about 180° C., or about 170° C., to assist the transfer of a sufficient amount of material. Additionally, an overall contact pressure of between about 2.5 kg and about 3.5 kg applied to each die (kg/die), for example 3.0 kg/die, applied for a duration of between about 30 seconds and about 70 seconds, for example about 50 seconds, results in sufficient pressure between the bumps and the conductive powder to assist the transfer of conductive powder to the bumps. In another embodiment, the pressure applied results in an average pressure of between about 3 grams (g) and about 5 g of pressure per bump (g/bump). This pressure can be optimized, depending on the process used and the structure and materials being used.

Figure 4:
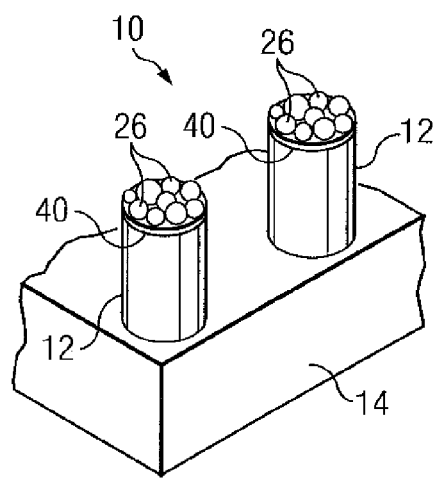
FIG. 4 depicts a close up perspective view of conductive bumps subsequent to the application of conductive powder.

The amount of conductive powder material on the bumps of an in-process semiconductor device assembly should be controlled to reduce bridging of solder across adjacent bumps and to minimize excessive conductor. In one embodiment, the solder powder can be applied to just the tips of the end of the bumps as depicted in FIG. 4 such that the solder powder does not adhere to exposed sides of the bump but adheres to the adhesive 40 on the tip of the end of the bumps 12 and to provide a conductor which is self-aligned to the bumps. Applying powder 26 to only the tips of the bumps will allow for minimum spacing between adjacent bumps, but powder and/or adhesive can also be applied to the sides of the bumps if it improves manufacturing. Sufficient conductive powder can be applied to ensure proper electrical contact with landing pads of a receiving substrate. To provide a quantity of conductive powder which is sufficient to facilitate electrical connection while minimizing bridging with adjacent bumps, a single layer of powder can be applied to each bump. In this embodiment, the conductive powder can extend between about 5 μ and about 15 μ away from the tip of the bump, because each spheroid from which the powder is comprised ranges from about 5 to about 15 μ in diameter.

Figure 5:
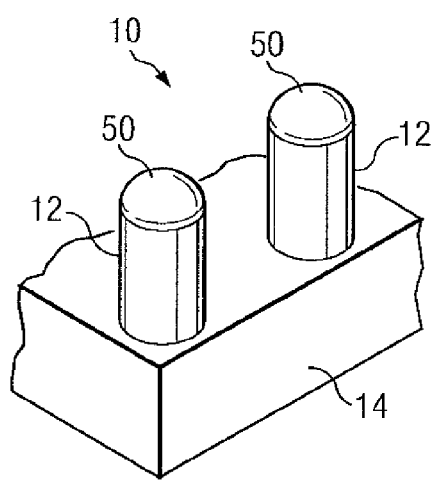
FIG. 5 depicts the conductive bumps of FIG. 4 after a solder flow process.

After applying the conductive powder to the bump ends as depicted in FIGS. 3 and 4, a solder flow process is performed to distribute the conductive powder across the ends of the bumps to result in the solder cap structures 50 as depicted in FIG. 5. The flowed powder is then cooled and solidified. Flowing the conductive powder alters the powder from a plurality of individual spheroids to a single conductive layer. In this embodiment, the solder is flowed but remains only on the ends of the bumps and is preferably a domed solder cap similar to that depicted. In this embodiment, the bumps are between about 10 μ and about 50 μ in diameter, and the center height of the domed solder will extend to between about 8 μ and about 15 μ away from the bump. To flow the solder, the semiconductor die 10 can be placed into a nitrogen ambient to reduce oxidation at a temperature of between about 220° C. and about 260° C. for a duration of between about 60 seconds and about 90 seconds.

After flowing the solder, the solder and bumps can be cleaned using conventional techniques, for example immersion in heated isopropyl alcohol (IPA) followed by an ultrasonic cleaning A post flow cleaning is particularly useful when the transfer of the powder from the film to the bump is performed at a temperature greater than 180° C., which can result in increasing amounts of residue formation which may hinder electrical connection with the receiving substrate. Thus using a transfer temperature of 180° C. or less can result in minimal residue.

Figure 6:
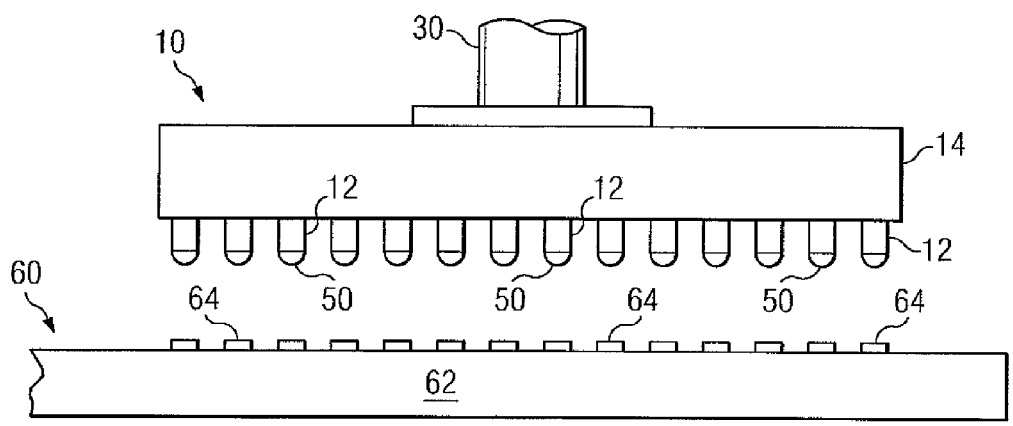
FIG. 6 is a cross section depicting the placement of a semiconductor wafer section such as a die in close proximity to a receiving substrate such as a ceramic substrate having landing pads in preparation for assembly.
Figure 7:
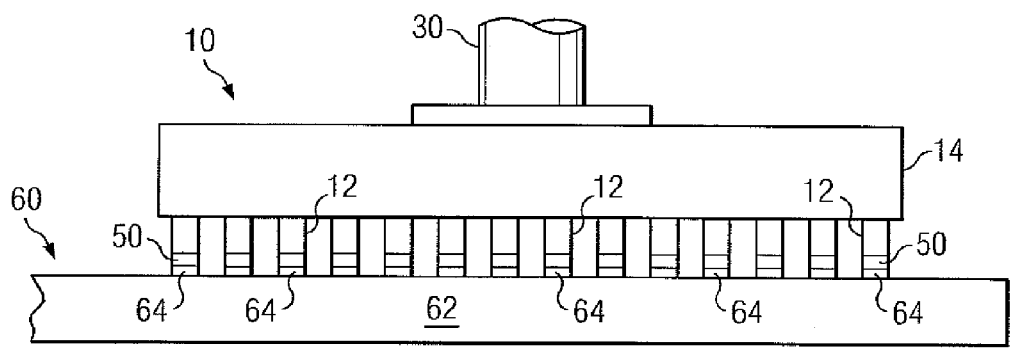
FIG. 7 depicts, in cross section, the structures of FIG. 6 after electrical connection using the conductive powder.
Figure 8:
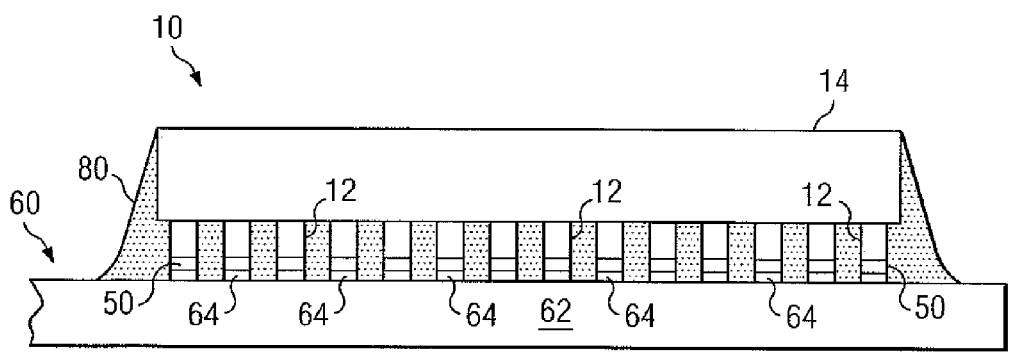
FIG. 8 depicts the FIG. 7 structure after formation of an optional supporting underflow.

After powder flow and cleaning, and the application of any additional flux, the semiconductor device 10 can be attached to the receiving substrate 60. The receiving substrate 60 can comprise a semiconductor layer, a ceramic layer, a PCB layer, etc. 62 having circuitry thereon and/or therein (not depicted) and conductive landing pads 64 adapted for electrical connection with the conductive bumps 12. The bumps 12 of the semiconductor device 10 are aligned with the landing pads 64 of the receiving substrate 60 as depicted in FIG. 6, and then contacted with the landing pads. Heat sufficient to reflow the solder is applied, for example using an infrared (IR) reflow and the application of pressure, to result in the structure depicted in FIG. 7. Depending on the type of solder used, reflow can occur at a temperature of between about 220° C. and about 260° C. The IR reflow can continue for a duration of between about 60 seconds and about 90 seconds, or for any duration required to facilitate electrical connection between the bumps and the landing pads. Subsequently, an underfill 80 can be employed to improve mechanical connection between the semiconductor device 10 and the receiving substrate 60 according to known manufacturing techniques.

Figure 9:
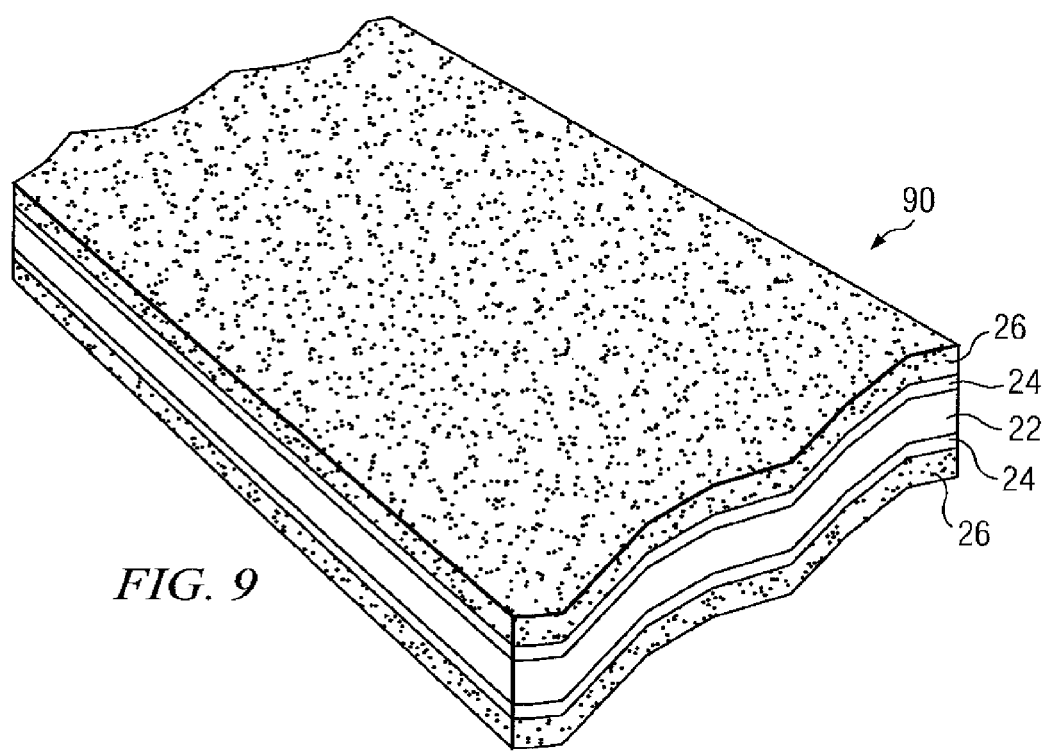
FIG. 9 is a perspective depiction of a film having conductive powder on two sides of a supporting carrier film.
Figure 10:
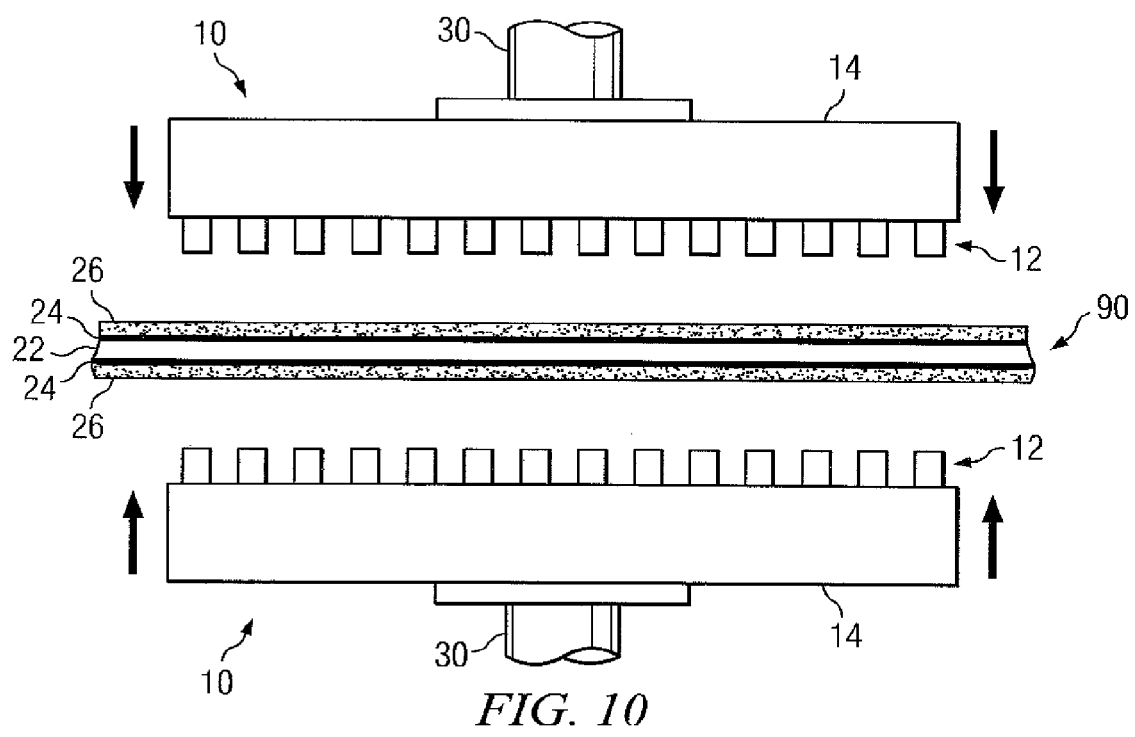
FIG. 10 is a cross section depicting one possible use of the film of FIG. 9.

Another embodiment is depicted in FIGS. 9 and 10. In this embodiment, film 90 comprises a layer of supporting carrier material 22 such as polyimide, two layers of adhesive 24, and two layers of conductive powder 26 such as solder powder. The materials, thicknesses, and formation of the supporting carrier material 22, adhesive 24, and solder powder 26 can be in accordance with the embodiments described above, with the adhesive 24 and powder 26 applied to both sides of supporting material 22. The base polyimide film can be coated on both sides with the adhesive material first, then solder powder can be applied (spray coated) on to the adhesive material on both sides of the supporting material 22. Alternately, the adhesive and solder powder can both be applied to only one side, with both being subsequently applied to the other side.

As with previous embodiments, it will be appreciated that the supporting material 22 can be omitted if the adhesive layer 24 also functions as the supporting material, in which case the film can comprise one layer of adhesive and two layers of conductive powder, with each conductive powder layer adhered to a different side of the adhesive.

Using two conductive powder layers as depicted in FIG. 9 is believed to increase production throughput over the embodiment of FIG. 2, as will be understood by one of ordinary skill in the art from the text below.

In one particular use, the two-sided conductive powder film can supported at either end, for example using a pair of reels (not depicted) which store additional film, so that both sides of the film 90 are accessible as depicted in FIG. 10. Two semiconductor dice 10 in accordance with the previous embodiment are loaded into a carrier such as a pair of vacuum nozzles 30 of a pick-and-place system. Solder flux can be applied as an adhesive to the bumps 12, for example by dipping the ends of the bumps in flux material, then the bumps of both dice are placed in contact with the conductive powder. In this embodiment, one die 10 contacts each side of the film 90 in opposite directions as depicted in FIG. 10 such that the adhesive on the bumps contacts the conductive powder 26 with sufficient pressure and temperature to transfer the powder from the film to the ends of the bumps. After the application of a sufficient amount of solder powder to the bumps, such as that depicted in FIG. 4, processing for each die 10 can continue according to previous embodiments.

Figure 11:
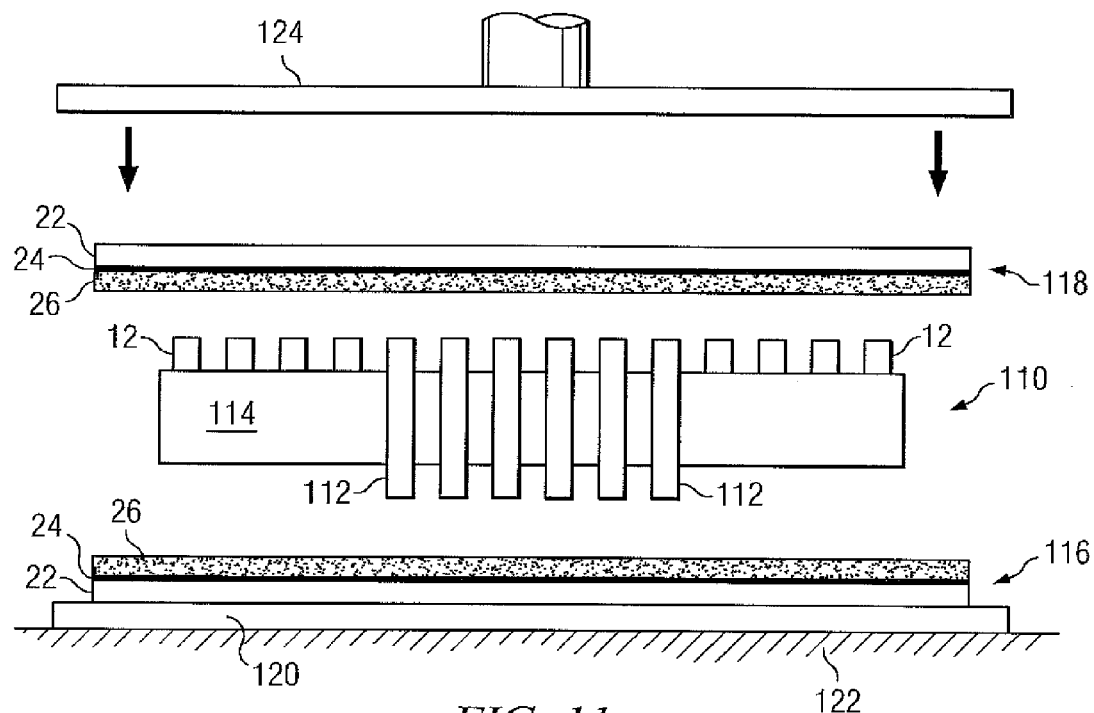
FIG. 11 is a cross section depicting another embodiment of the invention wherein two single sided strips of film are used to place conductive powder simultaneously on two sides of a device.
Figure 12:
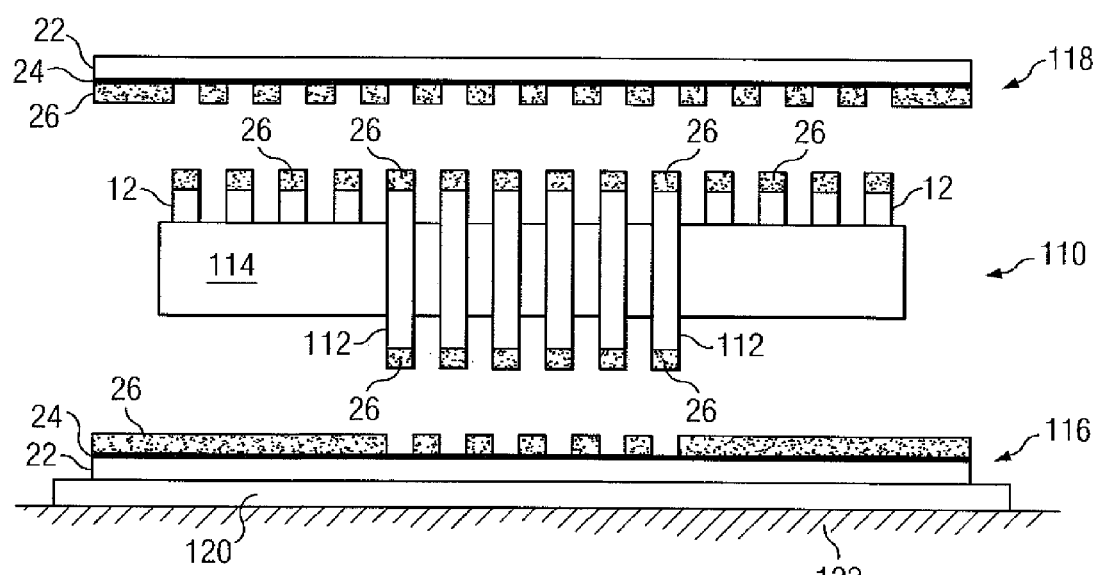
FIG. 12 depicts the FIG. 11 structure after application of conductive powder to bumps of the semiconductor device.

Another embodiment is depicted in the cross sections of FIGS. 11 and 12. In this embodiment, device 110 can comprise a semiconductor wafer, a semiconductor wafer section, a silicon or organic interposer, etc. comprising through substrate vias (TSVs) having conductive portions 112 extending through the substrate 114 to form bumps on each side of the substrate. Other similar embodiments would include a device without TSVs 112 but with bumps 12 on both sides of the substrate 114, and also a device including bumps 12 on both sides of the substrate along with TSVs. In various embodiments, the substrate 114 may comprise silicon, ceramic, a PCB, etc.

In this embodiment, a first strip 116 and a second strip 118 of single sided film are provided, each of which comprises a carrier material 22 such as polyimide, an adhesive 24 such as a thermoplastic or thermoset, and a conductive powder 26 such as eutectic solder, lead-free solder, etc. in accordance with embodiment of FIG. 2. Similarly, the single sided films can comprise only an adhesive layer and a conductive powder, if the adhesive layer can perform the function of the carrier material.

The first strip of film 116 can be placed directly onto a flat surface 122, or can also be placed onto a temperature controlled surface or chuck 120 as depicted to facilitate heating to a desired transfer temperature. After any required cleaning, fluxing, etc., the lower surface (as depicted) of device 110 can be placed to contact the conductive powder 26 of the first strip of film 116. Next, the second strip of film 118 is placed in contact with the upper surface (as depicted) of device 110, for example using a pressure plate 124, which can be temperature controlled to facilitate heating to a desired transfer temperature. Either or both of the conductive powder films may comprise the use of a reel as with previous embodiments. Sufficient pressure is applied between the first strip of film 116, the device 110, and the second strip of film 118 using pressure plate 124 in conjunction with the heated chuck 120 and/or flat surface 122 to cause the conductive powder 26 to adhere to the bumps 12, 112. The pressure plate 124 is then removed and device 110 is separated from the conductive powder film 116, 118, such that the conductive powder 26 remains on the tips of bumps 12, 112 of device 110. Processing can then continue according to previous embodiments, including solder flow in a nitrogen ambient and cleaning of the flowed solder. Attachment of device 110 to one or more receiving assemblies can be performed in accordance with the type of device being produced.

To increase the amount of solder powder on the tips of bumps, repeated contact between the bumps and the solder powder may be performed. The amount of conductive powder on the tips of the bumps should be controlled, however, so that bridging of the solder between adjacent bumps is avoided, unless there is reason for bridging adjacent bumps.

Various devices can be attached using variations on the embodiments described above. Processing of one or more complete wafers, portions of diced wafers (i.e. wafer sections or dice), different styles of connections such as ball grid array devices, flip chip devices, and other surface-mount devices, TSVs, through-hole devices such as dual in-line packages and single in-line packages, etc. can be performed through use of the described embodiments or variations thereof.

The above-described embodiments can be modified from the particular processes specified. For example, additional or different device and substrate preparation, fluxing, and cleaning steps, as well as forming of the flowed solder into a particular shape using mechanical techniques to improve connection with the receiving substrate, can be performed without departing from the scope of the present invention.

Thus various embodiments provide a dry solder (dry conductive powder) process which avoids exposing the semiconductor wafer or wafer section to harsh chemicals which are used with some wet solder processes. Further, the conductive powder can be applied to the tips of the bumps such that the sides are not coated, which reduces bridging of the solder across adjacent bumps and can allow for closer spacing between adjacent bumps. While conventional processes can require more than 115 μ spacing between adjacent bumps, various embodiments may allow for a spacing in the 50 to 60 μ range or below. Additionally, a wave solder line or other wet solder processing equipment is not required, thereby reducing space requirements and capital expenditures.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method used to form a semiconductor device, comprising:
   providing a carrier material having first and second sides and a solder powder coated on both the first and second sides of the carrier material;
   providing a first semiconductor die and a second semiconductor die each having conductive bumps thereon;
   simultaneously contacting the conductive bumps on the first semiconductor die with the solder powder on the first side of the carrier material and the conductive bumps on the second semiconductor die with the solder powder on the second side of the carrier material to simultaneously adhere the solder powder to the bumps on the first semiconductor die and on the second semiconductor die; and
   flowing the solder powder to distribute the solder powder across an end of the conductive bumps of the first semiconductor die and the second semiconductor die.

2. The method of claim 1, further comprising coating the conductive bumps with adhesive.

3. The method of claim 2, in which the adhesive includes solder flux.

4. The method of claim 1, further comprising a step of separating the conductive bumps having transferred solder powder from the carrier, and a step, subsequent to separating step, of flowing the solder powder and distributing the flown solder across an end of the conductive bumps.

5. The method of claim 1 wherein the solder powder comprises a plurality of solder spheroids.

6. The method of claim 5 wherein the solder spheroids have an average diameter of about 10 μm and range from between about 5 μm and about 15 μm in diameter.

7. The method of claim 1 wherein flowing the solder powder results in a domed solder cap on the end of the conductive bumps.

8. The method of claim 1 wherein the carrier provided comprises an adhesive and the solder powder.

9. The method of claim 8 further comprising maintaining a temperature of between about 165° C. and about 180° C. during contacting the conductive bump with the solder powder.

10. The method of claim 1, wherein the solder powder does not adhere to sides of the conductive bump perpendicular to the ends.

11. The method of claim 1, wherein the conductive bumps are formed on and part of a complete semiconductor wafer.

* * * * *